(12) United States Patent
Kang

(10) Patent No.: US 7,291,004 B2
(45) Date of Patent: Nov. 6, 2007

(54) MOLDING SYSTEM HAVING A MICRO HEATING ELEMENT FOR MOLDING A MICRO PATTERN STRUCTURE

(75) Inventor: Shinill Kang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 281 days.

(21) Appl. No.: 10/541,154

(22) PCT Filed: Dec. 31, 2003

(86) PCT No.: PCT/KR03/02939

§ 371 (c)(1),
(2), (4) Date: Jun. 30, 2005

(87) PCT Pub. No.: WO2004/058479

PCT Pub. Date: Jul. 15, 2004

(65) Prior Publication Data

US 2006/0073227 A1 Apr. 6, 2006

(30) Foreign Application Priority Data

Dec. 31, 2002 (KR) ............... 10-2002-0088039

(51) Int. Cl.
*B29C 45/73* (2006.01)
(52) U.S. Cl. .................... 425/547; 425/548
(58) Field of Classification Search ........... 425/547, 425/548
See application file for complete search history.

(56) References Cited

U.S. PATENT DOCUMENTS

| 2,714,226 | A | * | 8/1955 | Axelrad ................ 425/547 |
| 5,176,839 | A | | 1/1993 | Kim |
| 5,569,474 | A | | 10/1996 | Kitaichi et al. |
| 6,276,656 | B1 | | 8/2001 | Baresich |
| 7,129,322 | B2 | * | 10/2006 | Toyoshima et al. ..... 264/219 |

* cited by examiner

*Primary Examiner*—Tim Heitbrink
(74) *Attorney, Agent, or Firm*—Marger Johnson & McCollom, P.C.

(57) ABSTRACT

A molding system for molding a micro pattern structure includes a mold; a mold insert 6 having a micro pattern, the mold insert 6 being fixed to the mold; and a micro heating element 30 having a micro heater 32 between the mold and the mold insert 6, the micro heater 32 being formed in an integrated manner by using a MEMS process; wherein the amount of Joule's heat produced by the micro heater 32 is controlled by controlling the amount of electricity applied to the micro heater 32 so as to control a temperature of the mold insert 6. A method for fabricating the mold insert 6 for molding the micro pattern structure, the mold insert 6 being heated by a micro heater 32, includes the steps of: coating a photoresist on a back side of either the mold insert 6 or a plate 40 fixed onto the mold insert 6; patterning the photoresist by removing a part of the photoresist corresponding to the micro heater 32 using a lithography process; coating a material for forming the micro heater 32; and removing the residual photoresist.

11 Claims, 8 Drawing Sheets

MOLDING SYSTEM HAVING A MICRO HEATING ELEMENT FOR MOLDING A MICRO PATTERN STRUCTURE

BACKGROUND OF THE INVENTION

This application claims the priority of Korean Patent Application No. 10-2002-0088039, filed on Dec. 31, 2002 in the Korean Intellectual Property Office, and PCT/KR2003/002939, filed Dec. 31, 2003, the disclosures of which are incorporated herein in their entirety by reference.

1. Field of the Invention

The present invention relates to a molding system having a micro heating element and a method for fabricating a mold insert used therein. More particularly, the present invention relates to the molding system for molding a micro pattern structure having the micro heating element which includes a micro heater formed in an integrated manner by using a MEMS (MicroElectroMechanical Systems) process, and the method for fabricating the mold insert for molding the micro pattern structure used therein.

2. Description of the Related Art

Now, an injection molding, an injection compression molding, a compression molding and a hot embossing molding are being used for forming a high-performance plastic product having a micro pattern such as an optical disc substrate, a light guide plate, a micro lens array and a diffraction optical device.

The injection molding is a method in which a hot molten resin is injected into a mold and then is cooled. The injection compression molding is a method in which a cavity in the mold is set to be larger than a desired size and then is compressed to the desired size in the middle of a following injection. The injection compression molding has advantages that it can decrease an injection pressure to be applied to the resin and enhance a transcribability for a micro pattern.

The compression molding and the hot embossing molding are methods in which a plastic material of a powder, film, or block type is compressed with a mold heated to a predetermined temperature.

FIG. 1 illustrates a conventional molding system for the injection molding or injection compression molding and FIG. 2 is illustrates another conventional molding system for the compression molding or a hot embossing molding.

A mold insert 6 having a micro/nano pattern 8 on it is fixed onto a front side of a mold. (Here, the front side of the mold is a side facing a molding material and a back side of the mold is an opposite side thereto.) The mold includes a stationary part 2 and a moving part 4.

In the injection molding or injection compression molding, a cooling channel 10 is formed in the mold. Instead, a heating plate can be fixed onto the outer surface of the mold. The mold is heated to a desired temperature with a hot fluid heated to a predetermined temperature, and then a molten resin is injected into a cavity 12 through a sprue 14.

In the compression molding or hot embossing molding, a heater 16 is fixed onto the backside of the mold. The heater 16 heats the whole of the mold.

However, in the above molding systems, a quick heating and cooling is difficult and thus there are many problems. For example, in the injection molding or injection compression molding, as soon as a resin with high temperature is injected into the cavity of the mold and contacts with the mold, a solidified layer is created due to the temperature difference between the resin and the mold.

FIGS. 3A and 3B show that flow resistance increases and transcribability deteriorates in case of a center gate type (FIG. 3A) and a side gate type mold (FIG. 3B) due to growth of the solidified layer in the process of molding plastics using the conventional injection molding method or injection compression molding method.

Once the solidified layer is created, fluidity deteriorates and in result, it is difficult to completely transfer the micro/nano pattern. In addition, low fluidity makes the pressure applied onto the resein and the residual stress increase, which deteriorates mechanical and optical performance of products.

If a length of the cavity is large in comparison with a thickness thereof, these problems become worse and a more serious defect is caused. For example, in connection with an optical disc substrate, now it is technically possible to manufacture a DVD (Digital Versatile Disc) substrate with a diameter of 120 mm and a thickness of 0.6 mm satisfying diverse property requirements. However, if the size is smaller, that is, if the thickness is smaller than 0.6 mm, a complete filling during the injection molding is difficult due to the solidified layer. Even if a complete filling is attained, properties of the substrate become worse due to the residual stress. These problems are not only for the optical disc substrate but also for other high-performance plastic goods with a micro pattern.

In the compression molding and hot embossing molding, a conventional molding system has a disadvantage that because the whole of the mold has to be heated/cooled, a heating/cooling time is long and effectiveness of heating/cooling is low.

To solve these problems, heating means in contact with a front side or a back side of a mold insert which heats the mold insert are suggested. These heating means are disclosed, for example, in U.S. Pat. Nos. 6,276,656, 5,569,474, and 5,176,839.

FIG. 4 illustrates another conventional molding system as disclosed in the 656' patent.

A heater 147 is in the vicinity adjacent to the periphery of a cavity 110 and in thermal contact with a back side of a mold insert 132. Reference numerals 114, 120 and 124 represent boosters. Reference numerals 112, 122 represent fluid passages. Reference numerals 118, 128 and 140 represent a moving part, a stationary part, and an entrance, respectively.

Compared with the molding system in FIG. 1 and FIG. 2, molding systems in which the mold contacts with the front or back side of the mold insert have a advantage that the mold insert can be quickly heated and thus a response speed is very fast. Therefore, it is possible to improve transcribability and mechanical and optical properties of products. However, these molding systems have disadvantages below.

In the molding systems as disclosed in the 474' patent and the 839' patent, the heater is formed on a front side of a mold insert. This deteriorates transcribability for a micro pattern on the mold insert. Therefore, these molding systems are not suitable to form a micro pattern structure.

In the injection molding, injection compression molding, compression molding, and hot embossing molding, temperature is an important parameter. We can improve the quality of the products by detecting the temperature and using it in the molding process. In the molding system as disclosed in the 656' patent, the 474' patent and the 839' patent, the heater is conventionally attached or coated onto the mold insert. The above patents do not refer to a temperature sensor. However, if a temperature sensor has to be used as a component part of the molding system, it will be fixed onto the mold insert. That is, the temperature sensor as well as the heater is fixed onto the mold insert by a conventional way.

This conventional way requires much processing time and effort. Furthermore, it is very difficult to form a micro heater and a micro sensor at an exact position by the conventional way. Especially, if the plurality of the micro heaters and the plurality of the micro temperature sensors have to be formed, it is almost impossible to form them at exact positions by the conventional way.

More importantly, the temperature controllability is still bad in these molding systems. We know from a theory, experience or experiment that the temperature is not uniform throughout a molding material in the middle of the molding process. This non-uniformity of local temperatures means that the solidification of the molding material proceeds at different speeds. The different solidification speeds cause the residual stress to be produced inside of the products. In result, a deformation of the products is caused and optical properties of the products deteriorate.

These problems have a very serious effect on the molding process for a structure with a micro pattern on it, such as an optical disc substrate, a light guide plate, a micro lens array and a diffraction optical device, because a defect, even if very slight, has a very serious effect on the micro pattern structure in proportion to its precision.

Therefore, in the injection molding, injection compression molding, compression molding and hot embossing molding, especially for forming the micro pattern structure, a local temperature control is required.

DISCLOSURE OF INVENTION

To solve the above problems, the present invention is provided with a micro heating elements between a mold and a mold insert with a micro/nano pattern so that the micro heating element can quickly heat and cool the mold insert in the middle of a molding process. Through this, it is possible to prevent a solidified layer from being created in the molding process, especially an injection molding or injection compression molding and in result, enhance transcribability for a micro pattern. In addition, it is possible to decrease flow resistance against a resin and prevent a residual stress from being produced in products and in result, form the high-performance micro/nano pattern plastic products with excellent precision and optical properties.

The present invention can quickly heat and cool a wall of a cavity in the middle of the molding process. Therefore, even if a length (l) of the cavity is much larger than a thickness (t) thereof and the mold insert has a micro pattern, it is possible to form products with excellent transcribability.

In the compression molding and hot embossing molding, a more effective molding is also possible by quickly heating and cooling predetermined parts of the mold insert.

Another object of the present invention is to fabricating a heater and a sensor through a batch processing or a relatively simple processing, by which it is possible to lower a fabrication time and effort.

Still another object of the present invention is to more improve mechanical and optical properties of products by detecting local properties (temperature, pressure) and executing a local heating based on them. To achieve this object, the plurality of the heaters and the plurality of the sensors are formed on the mold insert in an integrated manner.

According to a preferred embodiment of the present invention, the pressure as well as the temperature of the mold insert is measured. From the pressure and temperature, we can obtain a filling speed of the resin, a flow rate. These data are used in an analysis of the stress inside of the resin. The pressure data and the temperature data are organized to form a database. This database will be used in the following molding process. We will be able to know the state of the molding material in a very short time using this database.

To achieve the above objects, the present invention provides a molding system for molding a micro pattern structure including: a mold; a mold insert having a micro pattern, the mold insert being fixed to the mold; and a micro heating element having a micro heater between the mold and the mold insert, the micro heater being formed in an integrated manner by using a MEMS process; wherein the amount of Joule's heat produced by the micro heater is controlled by controlling the amount of electricity applied to the micro heater so as to control a temperature of the mold insert.

In addition, the present invention provides a method for fabricating a mold insert for molding a micro pattern structure, the mold insert being heated by a micro heater, the method including the steps of: coating a photoresist on a back side of either the mold insert or a plate fixed onto the mold insert; patterning the photoresist by removing a part of the photoresist corresponding to the micro heater using a lithography process; coating a material for forming the micro heater; and removing the residual photoresist.

BEST MODE FOR CARRYING OUT THE INVENTION

A molding system for molding a micro pattern structure having a micro heating element and a method for fabricating a mold insert for molding a micro pattern structure used therein in accordance with the present invention will now be described in detail with reference to the accompanying drawings.

The present invention is characterized in that it is possible to quickly heat and cool the mold insert 6 with a micro/nano pattern using a micro heater 32 formed in an integrated manner by using a MEMS (MicroElectroMechanical Systems) process, by which it is possible to improve transcribability for the micro/nano pattern and produce a high-performance micro-pattern structure with excellent properties.

Figure 1:
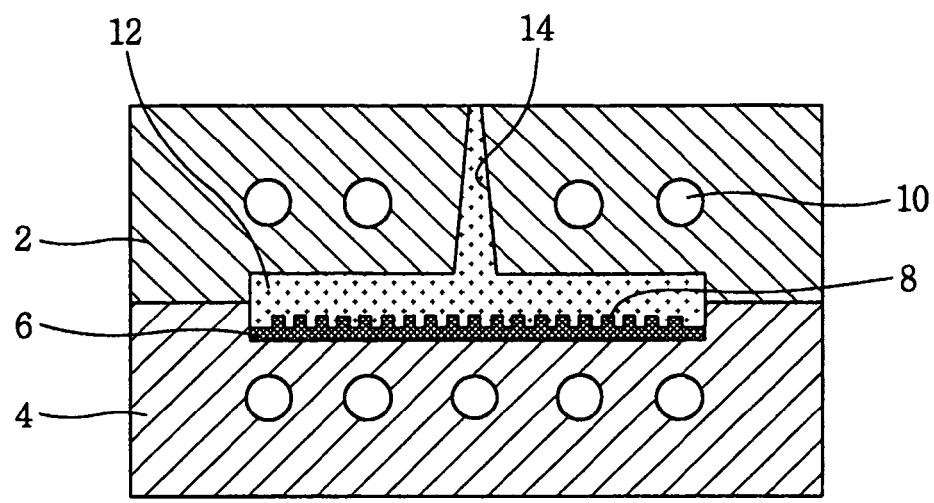
FIG. 1 illustrates a conventional molding system for an injection molding or an injection compression molding.
Figure 2:
FIG. 2 is illustrates another conventional molding system for a compression molding or a hot embossing molding.
Figure 2:
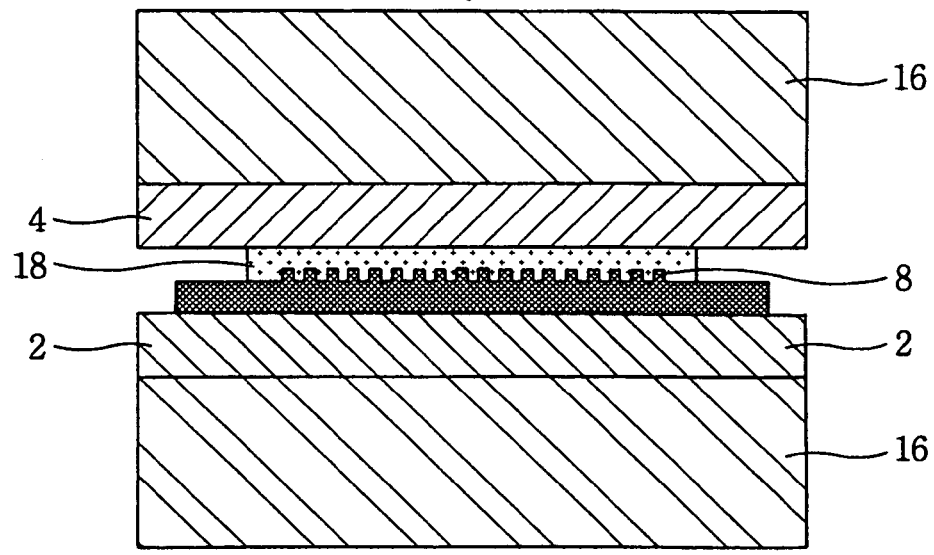
Figure 3A:
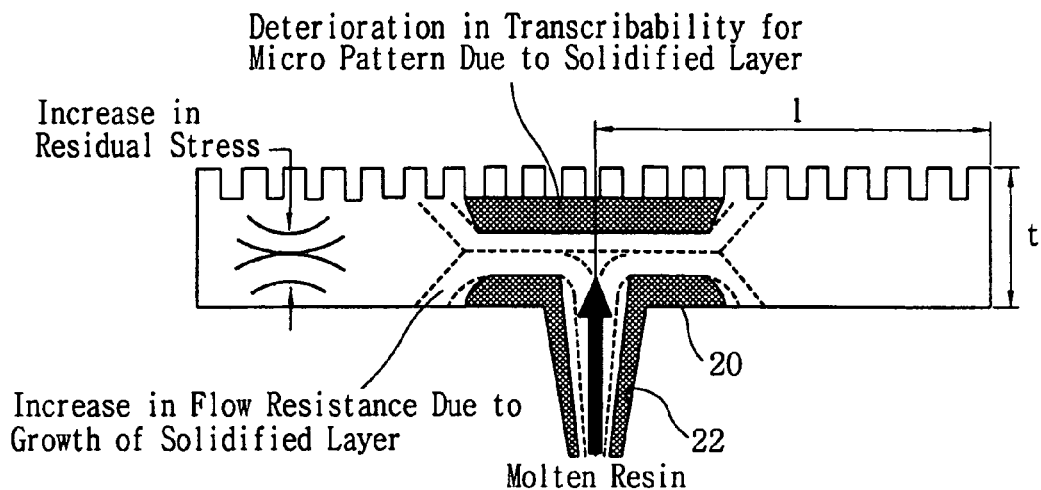
FIGS. 3A and 3B show that transcribability deteriorates and flow resistance increases in case of a center gate type mold (FIG. 3A) and a side gate type mold (FIG. 3B) due to growth of a solidified layer in the process of molding plastics using the conventional injection molding method or injection compression molding method.
Figure 3B:
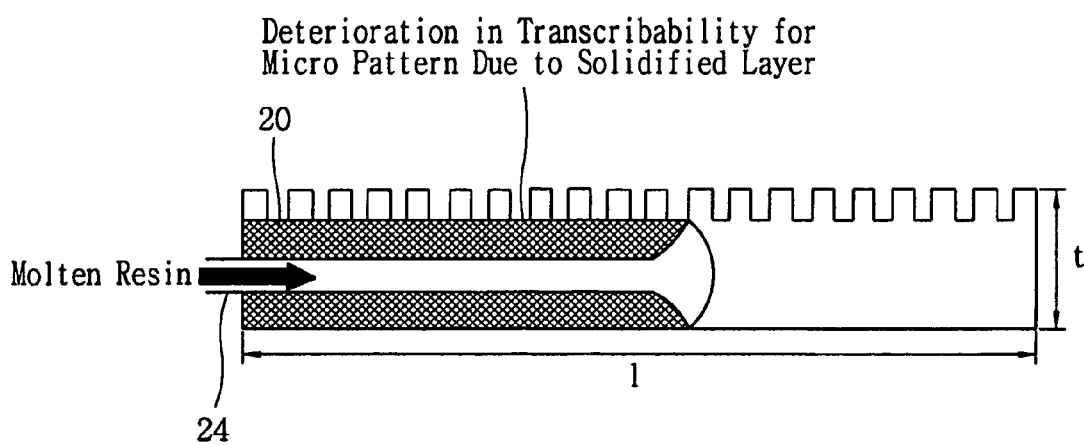
Figure 4:
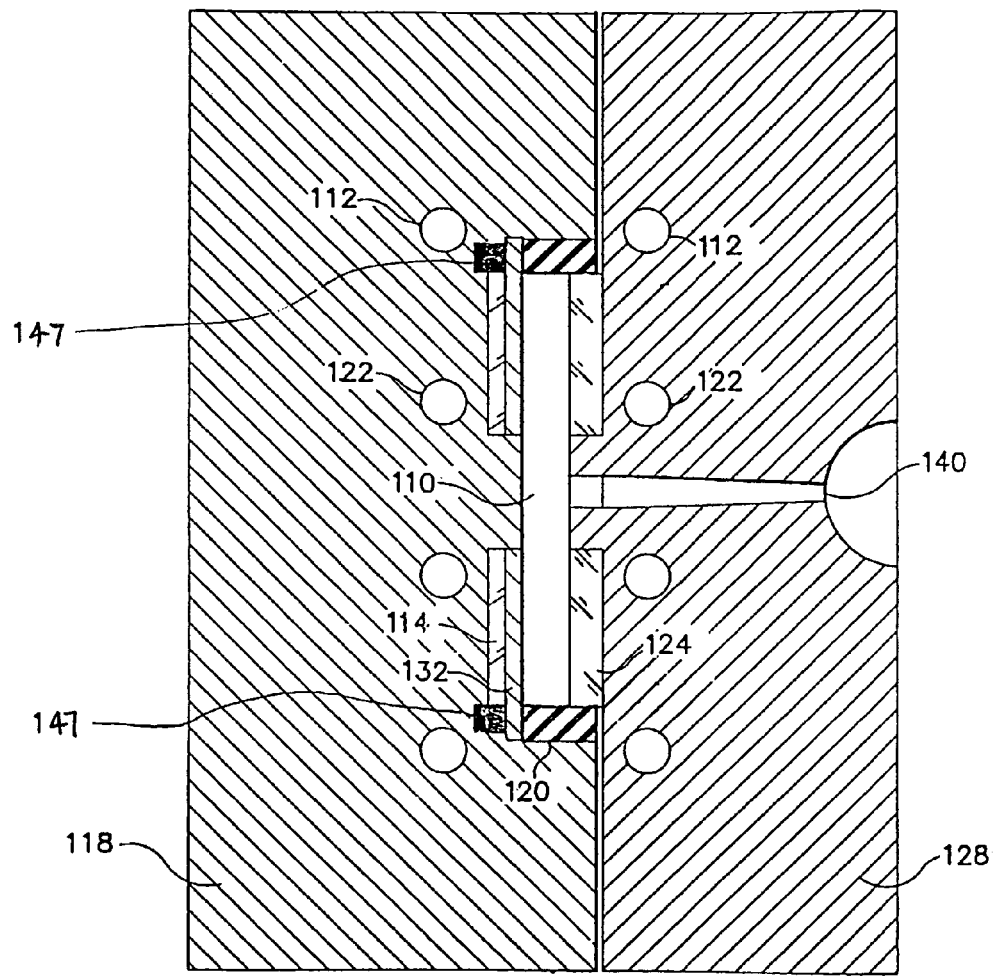
FIG. 4 illustrates another conventional molding system.
Figure 5:
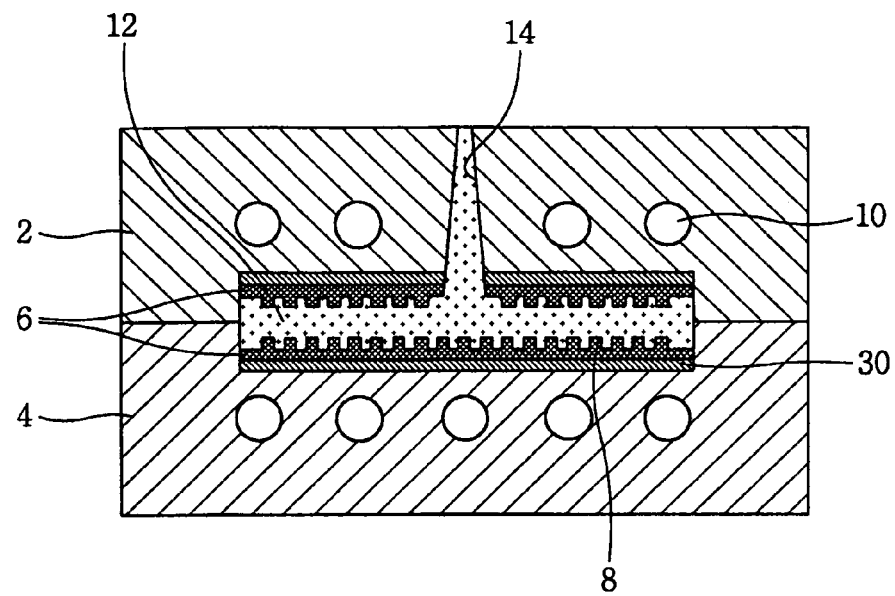
FIG. 5 is a side view of a molding system according to a preferred embodiment of the present invention.

In a molding system according to a preferred embodiment of the present invention, the micro heating element 30 with a MEMS structure which can control a temperature of the mold insert 6 by heating it is formed between the mold insert 6 and a mold. FIG. 5 is a side view of a molding system according to a preferred embodiment of the present invention.

Preferably, the micro heating element 30 is formed on a back side of the mold insert 6. If the micro heating element 30 is formed on a front side of the mold insert 6, transcribability for the micro pattern deteriorates. And, if the micro heating element 30 is formed on a front side of the mold 2, 4, a modification to the mold is required and thus a preliminary installation time and effort increase.

Figure 6:
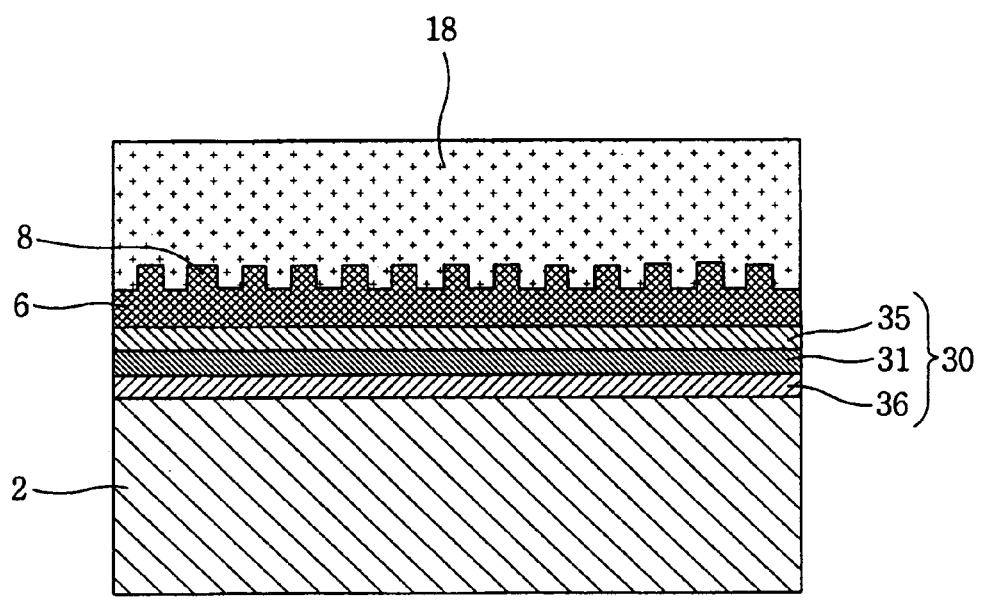
FIG. 6 is a side view of a molding system according to another preferred embodiment of the present invention.

FIG. 6 is a side view of a molding system according to another preferred embodiment of the present invention.

The micro heating element 30 in FIG. 6 includes a layer 31 in which the micro heater 32 is formed and insulators 35, 36 which encompass and protect the micro heating element 30. In the layer 31, a micro temperature sensor 33 and a micro pressure sensor 34 as well as the micro heater 31 can be formed.

The micro heating element 30 with a MEMS structure according to a preferred embodiment of the present invention heats the mold insert 6 with a Joule's heat which produced when electricity flows through a conductor, the micro heater 32. The micro heating element 30 includes the heater 32 through which electricity flows and the insulators 35, 36 which insulate the micro heater 32. The mold insert 6 is heated by the Joule's heat produced by the micro heater 32. The temperature of the mold insert 6 can be controlled by controlling the amount of electricity applied to the micro heater 32.

Figure 7:
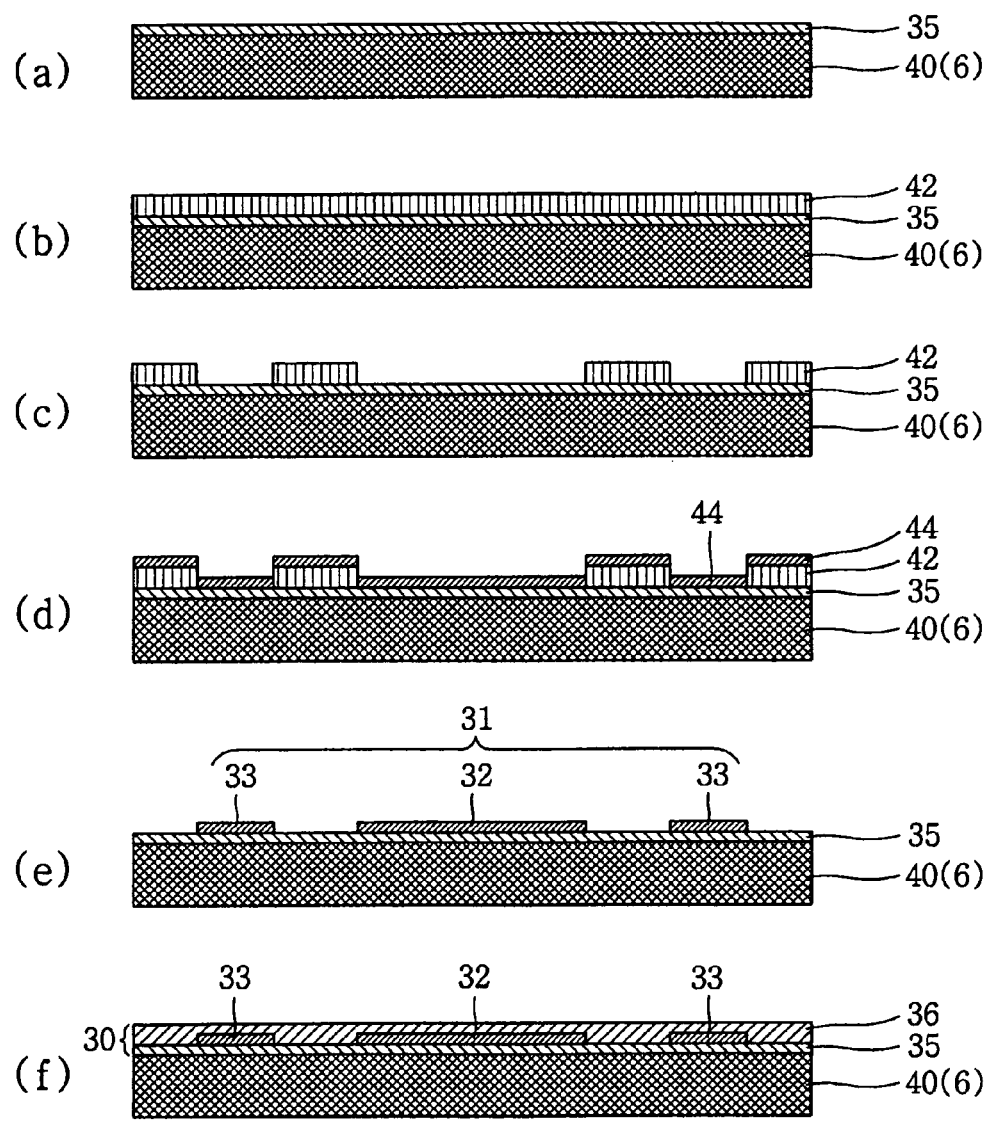
FIG. 7 shows a process for fabricating a mold insert which can be used in the molding system in FIG. 5 or FIG. 6.

FIG. 7 shows a process for fabricating the mold insert which can be used in the molding system in FIG. 5 or FIG. 6.

FIG. 7 shows that the micro heater 32 and the micro temperature sensor 33 are made of the same material through a lift-off process.

Firstly, an insulating material is coated onto the back side of either the mold insert or a plate fixed onto the mold insert to form an insulator 35. (step (a)) Various insulating materials including Polyimide can be used as a material for forming the insulator 35.

Thereafter, a photoresist 42 is coated. (step (b))

Thereafter, parts of the photoresist 42 corresponding to the micro heater 32 and micro temperature sensor 33, that is, parts of the photoresist 42 at which the micro heater 32 and micro temperature sensor 33 will be formed later is removed. (step (c))

Thereafter, a material for forming the micro heater 32 and micro temperature sensor 33 is coated. (step (d)) It is possible that various metal films are used as the material for forming the micro heater 32 and micro temperature sensor 33. The micro heater 32 can be formed in as various types, for example, a plate type, a series type or a parallel type.

After the residual photoresist is removed, the micro heater 32 and the micro temperature sensor 33 remain. (step (e))

Thereafter, an insulating material is spin-coated to form the insulator 36. (step (f)) A material which can be patterned by a lithography process is used as the material for forming the insulator 36 so that the micro heater 32 and the micro temperature sensor 33 can be wired later.

If the micro heating element 30 is formed on a plate, not the mold insert 33, the plate is fixed on the back side of the mold insert 6.

Thereafter, the micro heater 32 with a MEMS structure is wired up to an external electric source. The micro heater 32 can be quickly heated and cooled by controlling the amount of electricity supplied to the micro heater 32.

The temperature data detected by the micro temperature sensor 33 can be used in determining the voltage and current intensity for a required temperature.

Differently from a conventional method in which a heater and a temperature sensor are fixed by a simple attachment way, the micro heater 32 and the micro temperature sensor 33 are formed through a batch processing using a MEMS process. This enables a processing time and effort to be considerably reduced. Especially, if the micro heating element is formed on the mold insert 6 or plate 40 with a large area through a single process, and then the mold insert 6 or plate 40 with a large area is dice into pieces of required size, a processing time and effort can considerably be reduced.

In addition, although FIG. 7 shows the single micro heater 32 and the single micro temperature sensor 33, it is also possible that the micro heating element 30 can include the plurality of the micro heaters and the plurality of the micro temperature sensors.

In this case, a MEMS process enables the micro heaters 32 and micro temperature sensors to be formed in a precise shape at an exact position. In addition, it is possible to control the local temperatures of the mold insert 6, and thus the mechanical and optical properties of the product can be improved.

Figure 8:
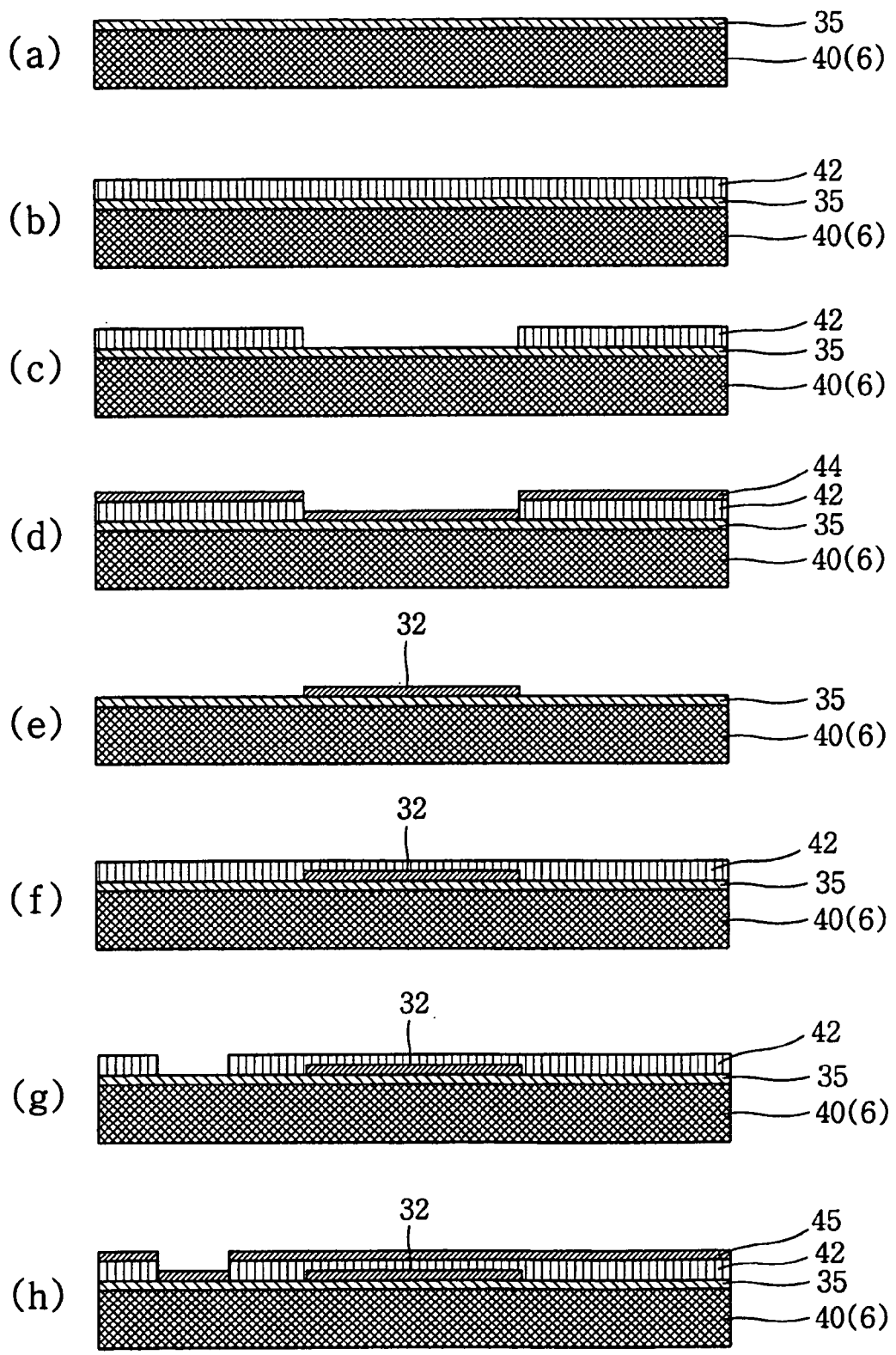
FIG. 8 shows a process for fabricating another mold insert which can be used in the molding system in FIG. 5 or FIG. 6.
Figure 8:
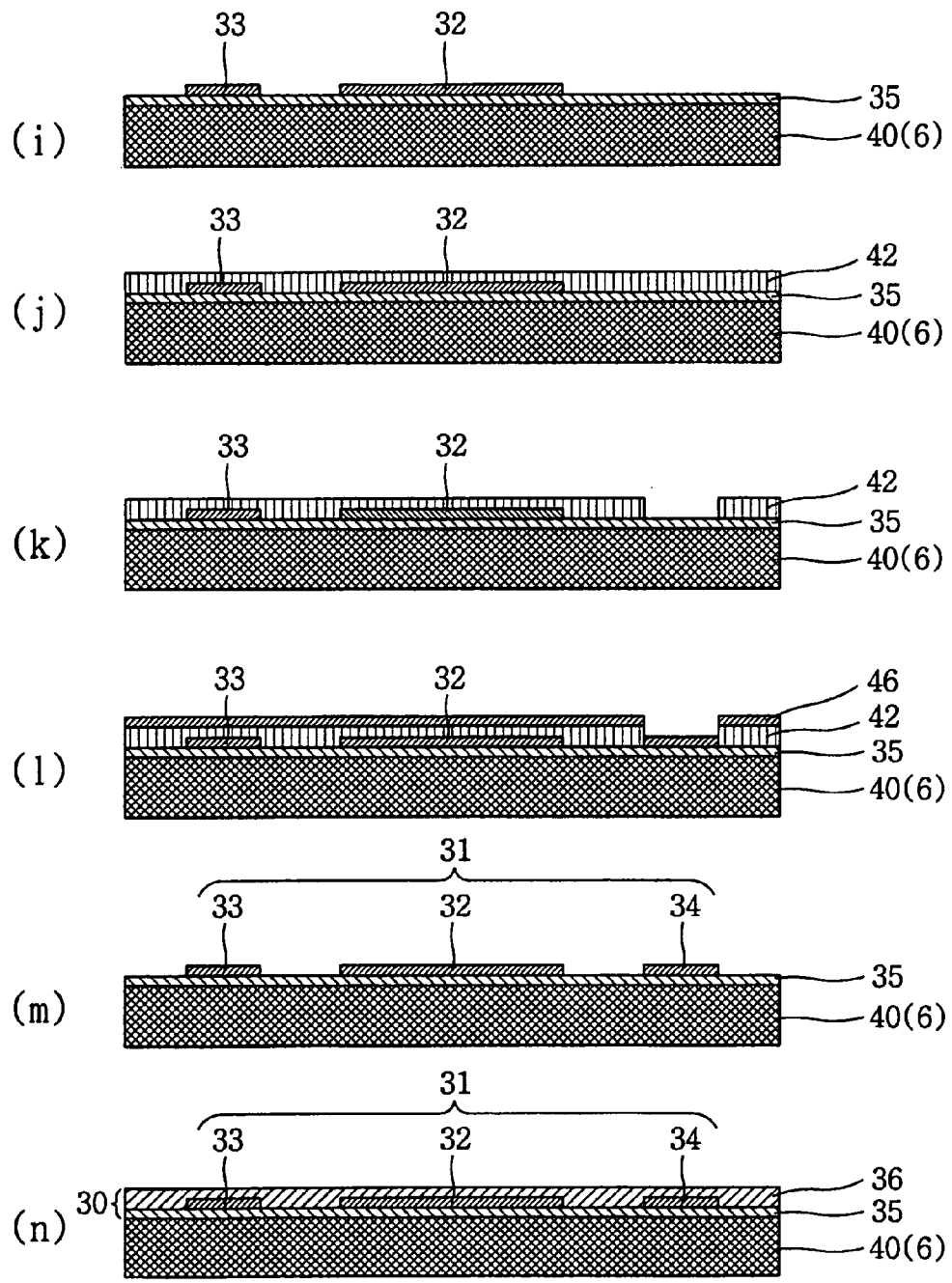

FIG. 8 shows a process for fabricating another mold insert which can be used in the molding system in FIG. 5 or FIG. 6.

In the embodiment of FIG. 7, the micro heater 32 and the micro temperature sensor 33 are made of the same material. However, it is also possible that they are made of different materials. Because the micro pressure sensor 34 and the temperature sensor 33 have to be made of different materials, individual processes for the micro sensors 33, 34 are required. In the embodiment of FIG. 8, a lift-off process is performed three times to form the micro heater 32, the micro temperature sensor 33 and the micro pressure sensor 34.

The micro temperature sensor 33 is made of a material whose resistance value changes with temperature. For example, the resistance value of certain metals including nickel, platinum, copper, and platinum-cobalt changes according to a temperature of an object in contact with them. The resistance value changes according to a fixed law. Therefore, the temperature of the micro temperature sensor can be obtained by measuring the resistance value.

The micro pressure sensor detects a pressure applied by the back side of the mold insert 6 to find out the pressure applied onto the mold insert 6 by the molding material. The micro pressure sensor 34 is made of a piezoelectric material. When a pressure is applied onto a piezoelectric material such as $PbTiO_3$ and $PbZrTiO_3$, a voltage changes depending on the pressure. Therefore, we can obtain the pressure value by detecting the voltage. Furthermore, we can obtain a filling speed of the molten resin, a flow rate, from that pressure value, and we use it in analyzing the stress inside of the resin.

The state of the molding material is evaluated and the Joule's heat of the micro heater 32 is controlled based on the temperature and pressure measured by the micro temperature sensor 33 and micro pressure sensor.

Figure 9:
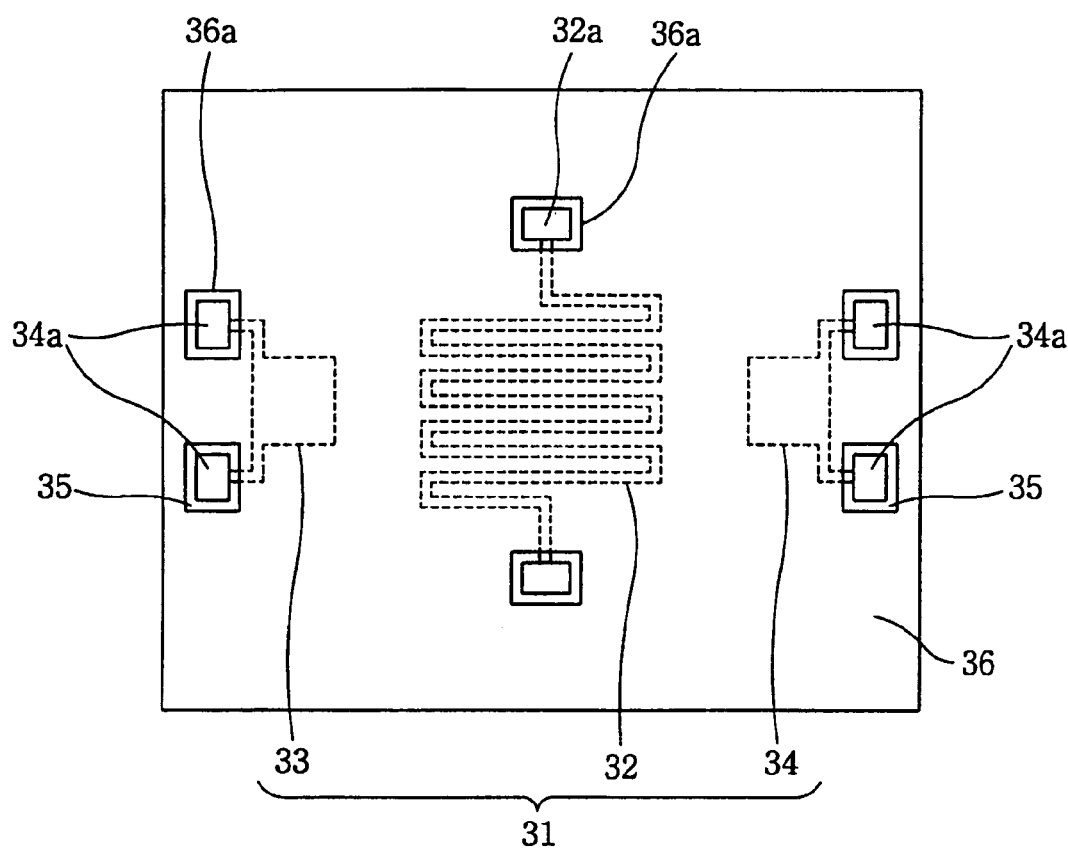
FIG. 9 illustrates a back side of the mold insert in FIG. 8.

FIG. 9 illustrates the back side of the mold insert in FIG. 8 in which parts 32a, 33a, 34a for wiring the micro heater 32, the micro temperature sensor 33 and the micro pressure sensor 34 are exposed.

After the step (n) of coating the insulating material, parts of the insulating material corresponding the parts 32a, 33a, 34a are removed to form windows 36a. The part 32a of the micro heater 32, the part 33a of the micro temperature sensor 33 and the part 34a of the micro pressure sensor 34 are exposed through the windows 36a. Thereafter, a wiring process follows.

The invention claimed is:

1. A molding system for molding a micro pattern structure comprising
    a mold;
    a mold insert having a micro pattern, the mold insert being fixed to the mold; and
    a micro heating element having a micro heater between the mold and the mold insert, the micro heater being formed in an integrated manner by using a MEMS process;
    wherein the amount of Joule's heat produced by the micro heater is controlled by controlling the amount of electricity applied to the micro heater so as to control a temperature of the mold insert.

2. The molding system for molding the micro pattern structure as claimed in claim 1,
    wherein the micro heating element comprises a micro temperature sensor formed in an integrated manner by a MEMS process, and
    the micro temperature sensor detects the temperature of the mold insert.

3. The molding system for molding the micro pattern structure as claimed in claim 2,
    wherein the micro temperature sensor is made out of a material whose resistance value changes with temperature.

4. The molding system for molding the micro pattern structure as claimed in claim 1,
    wherein the micro heating element comprises a micro pressure sensor formed in an integrated manner by a MEMS process, and
    the micro pressure sensor detects a pressure applied by the mold insert.

5. The molding system for molding the micro pattern structure as claimed in claim 4,
    wherein the micro pressure sensor is made of a piezo-electric material.

6. The molding system for molding the micro pattern structure as claimed in claim 2,
    wherein the micro heater and the micro sensor are fabricated by a lift-off process.

7. The molding system for molding the micro pattern structure as claimed in claim 2,
    wherein the micro heating element has the plurality of the micro heaters and the plurality of the micro sensors, to control local temperatures of the mold insert.

8. The molding system for molding the micro pattern structure as claimed in claim 2,
    wherein the micro heater and the micro sensor are formed on a back side of the mold insert.

9. The molding system for molding the micro pattern structure as claimed in claim 2,
    wherein the Joule's heat produced by the micro heater is controlled based on a value detected by the micro sensor.

10. The molding system for molding the micro pattern structure as claimed in claim 2,
    wherein values detected by the micro sensor are organized to form a database and the database is used in a following molding process.

11. The molding system for molding the micro pattern structure as claimed in claim 1,
    wherein the molding system further comprises an insulator for insulating the micro heater from the mold insert and the mold.

* * * * *